United States Patent
Nader et al.

(10) Patent No.: US 10,498,295 B2
(45) Date of Patent: Dec. 3, 2019

(54) FEEDBACK IN MISO SYSTEMS

(71) Applicant: Nokia Solutions and Networks Oy, Espoo (FI)

(72) Inventors: Charles Nader, Ulm (DE); Bjoern Jelonnek, Ulm (DE)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 16/311,742

(22) PCT Filed: Jun. 19, 2017

(86) PCT No.: PCT/EP2017/064873
§ 371 (c)(1),
(2) Date: Dec. 20, 2018

(87) PCT Pub. No.: WO2018/001763
PCT Pub. Date: Jan. 4, 2018

(65) Prior Publication Data
US 2019/0199295 A1    Jun. 27, 2019

(30) Foreign Application Priority Data

Jul. 1, 2016   (EP) ..................................... 16177464

(51) Int. Cl.
| | |
|---|---|
| *H04K 1/02* | (2006.01) |
| *H03F 1/32* | (2006.01) |
| *H03F 3/189* | (2006.01) |
| *H03F 3/21* | (2006.01) |

(52) U.S. Cl.
CPC .......... *H03F 1/3247* (2013.01); *H03F 1/3252* (2013.01); *H03F 1/3258* (2013.01); *H03F 1/3276* (2013.01); *H03F 3/189* (2013.01); *H03F 3/211* (2013.01)

(58) Field of Classification Search
CPC ...... H03F 1/3247; H03F 1/3258; H03F 3/189; H03F 1/3276
See application file for complete search history.

(56) References Cited

U.S. PATENT DOCUMENTS

| | | | | |
|---|---|---|---|---|
| 5,886,573 A | * | 3/1999 | Kolanek | ............... H03F 1/0277 330/10 |
| 7,317,750 B2 | | 1/2008 | Shattil | |
| 7,483,481 B1 | * | 1/2009 | Ghobrial | ........... H04L 25/03343 348/607 |

(Continued)

FOREIGN PATENT DOCUMENTS

WO   WO 01/08294 A1   2/2001

*Primary Examiner* — Dhaval V Patel
(74) *Attorney, Agent, or Firm* — Harrington & Smith

(57) ABSTRACT

It is provided a method for providing feedback to pre-distorters in branches of a MISO system such that the pre-distortion cancels distortions caused by the signal path and the combiner combining the signals from the branches into which input signals are input. The method includes generating uncorrelated noises and mixing them with the input signals, evaluating the output of the combiner based on the input signals and the noises in order to determine a respective contribution of each input signal to the output of the combiner, and accordingly determining an appropriate pre-distortion. The signal path may apply a non-linear and/or dynamic function on the signal.

20 Claims, 15 Drawing Sheets

(56) References Cited

U.S. PATENT DOCUMENTS

| | | | |
|---|---|---|---|
| 8,964,821 B2* | 2/2015 | Coan | H03F 1/3247 375/219 |
| 2016/0080051 A1 | 3/2016 | Sajadieh et al. | |

* cited by examiner

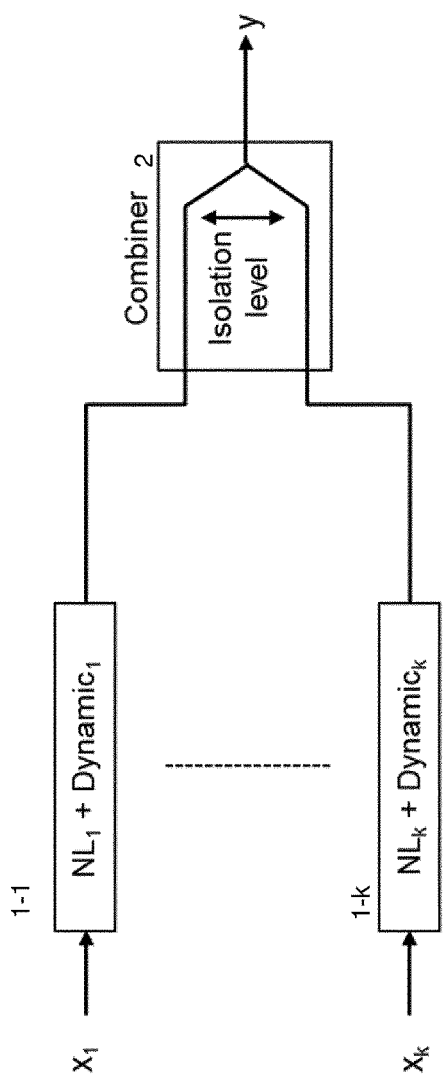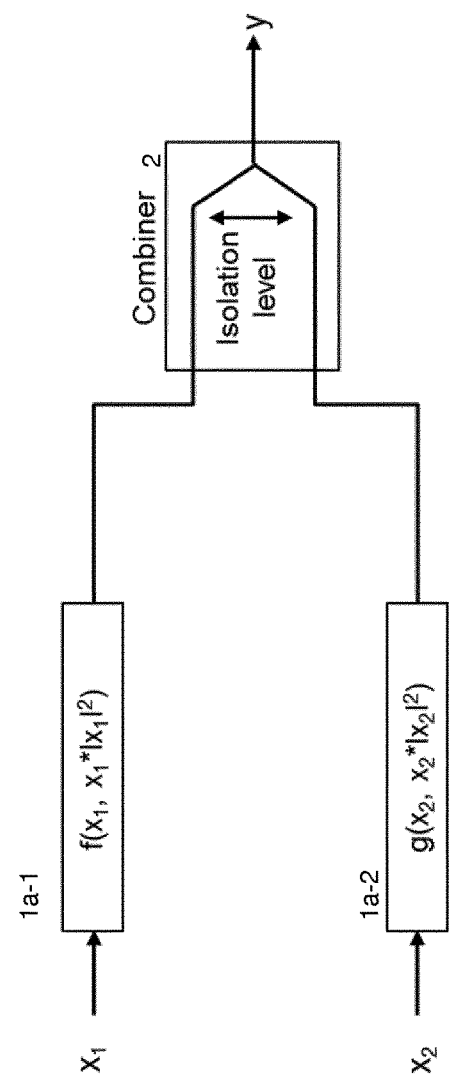

$$H^*H = \begin{bmatrix} R_{x^*,x} & R_{x^*,x^*|x|^2} & c^* R_{x^*,x} & c^*|c|^2 * R_{x^*,x^*|x|^2} \\ R_{x^{}|x|^2,x} & R_{x^{}|x|^2,x^*|x|^2} & c^* R_{x^{**}|x|^2,x} & c^*|c|^2 * R_{x^{**}|x|^2,x^*|x|^2} \\ c^* R_{x^*,x} & c^* R_{x^*,x^*|x|^2} & |c|^2 * R_{x^*,x} & |c|^4 * R_{x^*,x^*|x|^2} \\ c^*|c|^2 * R_{x^{**}|x|^2,x} & c^*|c|^2 * R_{x^{**}|x|^2,x^*|x|^2} & |c|^4 * R_{x^{**}|x|^2,x} & |c|^6 * R_{x^{**}|x|^2,x^*|x|^2} \end{bmatrix}$$

Formulation 4

Fig. 3

```
% Input signals generation:
x=randn(2^16,1)+1j*randn(2^16,1);
h=firpm(100,[0 .06 .2 1],[1 1 0 0]);
x=filter(h,1,x);
x1=x;
x2=0.8*exp(1j*1.3)*x;
% Nonlinear MISO system parametric coefficients:
f1=0.3-0.7j;  f3=-0.2-0.2j;
g1=0.8-0.2j;  g3=-0.1-0.09j;
y=f1*x1 +f3*x1*abs(x1)^2 + g1*x2 +g3*x2*abs(x2)^2;
% Solver
H=[x1 x1*abs(x1)^2 x2 x2*abs(x2)^2];
% abs(det(H'*H)) = 3.8499e-15
tik=max(max(abs(H'*H)))*2e-7*eye(size(H'*H,2))*1;
Eta=(H'*H+tik)\(H'*y);
% NMSE_estimation=-1.2dB
% [Eta [f1;f3;g1;g3]]= 0.3813 - 0.2073i    -0.1341 - 0.0769i     0.3000 - 0.7000i
                      0.0223 - 0.3104i    -0.2000 - 0.2000i    -0.2000 - 0.2000i
                     -0.1206 + 0.0378i     0.8000 - 0.1000i    -0.1000 - 0.0900i
```

Fig. 4

$$H^*H = \begin{bmatrix} R_{X_1^*+N_1^*, X_1+N_1} & R_{X_1^*+N_1^*, (X_1+N_1)^*|X_1+N_1|^2} & R_{X_1^*+N_1^*, X_2+N_2} & R_{X_1^*+N_1^*, (X_2+N_2)^*|X_2+N_2|^2} \\ R_{(X_1^*+N_1^*)|X_1+N_1|^2, X_1+N_1} & R_{(X_1^*+N_1^*)|X_1+N_1|^2, (X_1+N_1)^*|X_1+N_1|^2} & R_{(X_1^*+N_1^*)|X_1+N_1|^2, X_2+N_2} & R_{(X_1^*+N_1^*)|X_1+N_1|^2, (X_2+N_2)^*|X_2+N_2|^2} \\ R_{X_2^*+N_2^*, X_1+N_1} & R_{X_2^*+N_2^*, (X_1+N_1)^*|X_1+N_1|^2} & R_{X_2^*+N_2^*, X_2+N_2} & R_{X_2^*+N_2^*, (X_2+N_2)^*|X_2+N_2|^2} \\ R_{(X_2^*+N_2^*)|X_2+N_2|^2, X_1+N_1} & R_{(X_2^*+N_2^*)|X_2+N_2|^2, (X_1+N_1)^*|X_1+N_1|^2} & R_{(X_2^*+N_2^*)|X_2+N_2|^2, X_2+N_2} & R_{(X_2^*+N_2^*)|X_2+N_2|^2, (X_2+N_2)^*|X_2+N_2|^2} \end{bmatrix}$$

Fig. 6

Formulation 6

$$H^*H = \begin{bmatrix} R_{X^*+N_1^*, X+N_1} & R_{X^*+N_1^*, (X+N_1)^*|X+N_1|^2} & R_{X^*+N_1^*, cX+N_2} & R_{X^*+N_1^*, (cX+N_2)^*|cX+N_2|^2} \\ R_{(X^*+N_1^*)|X+N_1|^2, X+N_1} & R_{(X^*+N_1^*)|X+N_1|^2, (X+N_1)^*|X+N_1|^2} & R_{(X^*+N_1^*)|X+N_1|^2, cX+N_2} & R_{(X^*+N_1^*)|X+N_1|^2, (cX+N_2)^*|cX+N_2|^2} \\ R_{c^*X^*+N_2^*, X+N_1} & R_{c^*X^*+N_2^*, (X+N_1)^*|X+N_1|^2} & R_{c^*X^*+N_2^*, cX+N_2} & R_{c^*X^*+N_2^*, (cX+N_2)^*|cX+N_2|^2} \\ R_{(c^*X^*+N_2^*)|cX+N_2|^2, X+N_1} & R_{(c^*X^*+N_2^*)|cX+N_2|^2, (X+N_1)^*|X+N_1|^2} & R_{(c^*X^*+N_2^*)|cX+N_2|^2, cX+N_2} & R_{(c^*X^*+N_2^*)|cX+N_2|^2, (cX+N_2)^*|cX+N_2|^2} \end{bmatrix}$$

Fig. 7

Formulation 7

$$H^*H = \begin{bmatrix} R_{X^*+N_1^*,X+N_1} & R_{X^*+N_1^*,(X+N_1)^*|X|^2} & R_{X^*+N_1^*,cX+N_2} & R_{X^*+N_1^*,(cX+N_2)^*|cX|^2} \\ R_{(X^*+N_1^*)|X|^2,X+N_1} & R_{(X^*+N_1^*)|X|^2,(X+N_1)^*|X|^2} & R_{(X^*+N_1^*)|X|^2,cX+N_2} & R_{(X^*+N_1^*)|X|^2,(cX+N_2)^*|cX|^2} \\ R_{cX^*+N_2^*,X+N_1} & R_{cX^*+N_2^*,(X+N_1)^*|X|^2} & R_{cX^*+N_2^*,cX+N_2} & R_{cX^*+N_2^*,(cX+N_2)^*|cX|^2} \\ R_{(cX^*+N_2^*)|cX|^2,X+N_1} & R_{(cX^*+N_2^*)|cX|^2,(X+N_1)^*|X|^2} & R_{(cX^*+N_2^*)|cX|^2,cX+N_2} & R_{(cX^*+N_2^*)|cX|^2,(cX+N_2)^*|cX|^2} \end{bmatrix},$$

Formulation 8

Fig. 8

$$H^*H = [F1 \quad F2 \quad F3 \quad F4],$$

Formulation 9

Fig. 9

Formulation 10

$$F_1 = \begin{bmatrix} Q_{1,1} + R_{N_1^*,X} + R_{X^*,N_1} + R_{N_1^*,N_1} \\ Q_{2,1} + R_{N_1^*|X|^2,X} + R_{X^*|X|^2,N_1} + R_{N_1^*|X|^2,N_1} \\ c^* Q_{1,1} + R_{N_2^*,X} + c^* R_{X^*,N_1} + R_{N_2^*,N_1} \\ c^*|c|^2 Q_{2,1} + |c|^2 R_{N_2^*|X|^2,X} + c^*|c|^2 R_{X^*|X|^2,N_1} + |c|^2 R_{N_2^*|X|^2,N_1} \end{bmatrix},$$

$$F_2 = \begin{bmatrix} Q_{1,2} + R_{N_1^*,X|X|^2} + R_{X^*,N_1|X|^2} + R_{N_1^*,N_1|X|^2} \\ Q_{2,2} + R_{N_1^*|X|^2,X|X|^2} + R_{X^*|X|^2,N_1|X|^2} + R_{N_1^*|X|^2,N_1|X|^2} \\ c^* Q_{1,2} + R_{N_2^*,X|X|^2} + c^* R_{X^*,N_1|X|^2} + R_{N_2^*,N_1|X|^2} \\ c^*|c|^2 Q_{2,2} + |c|^2 R_{N_2^*|X|^2,X|X|^2} + c^*|c|^2 R_{X^*|X|^2,N_1|X|^2} + |c|^2 R_{N_2^*|X|^2,N_1|X|^2} \end{bmatrix},$$

$$F_3 = \begin{bmatrix} c^*(Q_{1,1} + R_{N_1^*,X}) + R_{X^*,N_2} + R_{N_1^*,N_2} \\ c^*(Q_{2,1} + R_{N_1^*|X|^2,X}) + R_{X^*|X|^2,N_2} + R_{N_1^*|X|^2,N_2} \\ c^*(c^* Q_{1,1} + R_{N_2^*,X}) + c^* R_{X^*,N_2} + R_{N_2^*,N_2} \\ c^*(c^*|c|^2 Q_{2,1} + |c|^2 R_{N_2^*|X|^2,X}) + c^*|c|^2 R_{X^*|X|^2,N_2} + |c|^2 R_{N_2^*|X|^2,N_2} \end{bmatrix},$$

$$F_4 = \begin{bmatrix} c^*(Q_{1,2} + R_{N_1^*,X|X|^2}) + |c|^2 R_{X^*,N_2|X|^2} + |c|^2 R_{N_1^*,N_2|X|^2} \\ c^*(Q_{2,2} + R_{N_1^*|X|^2,X|X|^2}) + |c|^2 R_{X^*|X|^2,N_2|X|^2} + |c|^2 R_{N_1^*|X|^2,N_2|X|^2} \\ c^*(c^* Q_{1,2} + R_{N_2^*,X|X|^2}) + c^* R_{X^*,N_2|X|^2} + |c|^2 R_{N_2^*,N_2|X|^2} \\ c^*(c^*|c|^2 Q_{2,2} + |c|^2 R_{N_2^*|X|^2,X|X|^2}) + c^*|c|^4 R_{X^*|X|^2,N_2|X|^2} + |c|^4 R_{N_2^*|X|^2,N_2|X|^2} \end{bmatrix},$$

```
% Input signals generation:
x=randn(2^16,1)+1j*randn(2^16,1);
h=firpm(100,[0 .06 .2 1],[1 1 0 0]);
x=filter(h,1,x);
x1=x;
x2=0.8*exp(1j*1.3)*x;
% Noise sequences generation
hn=firpm(32,[0 .2 .4 1],[1 1 0 0]);
n1=randn(2^16,1)+1j*randn(2^16,1);
n1=filter(hn,1,n1);
n1=n1/norm(n1)*norm(x)*10^(-40/20);
n2=randn(2^16,1)+1j*randn(2^16,1);
n2=filter(hn,1,n2);
n2=n2/norm(n2)*norm(x)*10^(-40/20);
% Noise insertion
x1_n=x1+n1;
x2_n=x2+n2;
% Nonlinear MISO system parametric coefficients:
f1=0.3-0.7j;   f3=-0.2-0.2j;
g1=0.8-0.2j;   g3=-0.1-0.09j;
y=f1*x1_n +f3*x1_n*abs(x1_n)^2 + g1*x2_n +g3*x2_n*abs(x2_n)^2;
% Solver
H=[x1_n x1_n*abs(x1_n)^2 x2_n x2_n*abs(x2_n)^2];
% abs(det(H'*H)) = 2.3152e+07
tik=max(max(abs(H'*H))*2e-7*eye(size(H'*H,2))*1;
Eta=(H'*H+tik)\(H'*y);
% NMSE_estimation= -146.55dB
% [Eta [f1;f3;g1;g3]]=   0.2999999999174 -  0.6999999786608i    0.3 - 0.7i
                        -0.1999999994742 -  0.200000000187792i -0.2 - 0.2i
                         0.7999999974513 -  0.200000000081143i  0.8 - 0.2i
                        -0.0999999967389 -  0.089999980303i    -0.1 - 0.09i
```

FEEDBACK IN MISO SYSTEMS

CROSS REFERENCE TO RELATED APPLICATION(S)

This patent application is a U.S. National Stage application of International Patent Application Number PCT/EP2017/064873 filed Jun. 19, 2017, which is hereby incorporated by reference in its entirety, and claims priority to EP 16177464 filed Jul. 1, 2016.

FIELD OF THE INVENTION

The present invention relates to MISO system. More particularly, the present invention relates to an apparatus and a method for improving conventional MISO systems e.g. for LTE and/or WCDMA, such as 3G, 4G, 5G and beyond.

Abbreviations 3G, 4G, 5G $3^{rd}$, $4^{th}$, $5^{th}$ Generation
3GPP $3^{rd}$ Generation Partnership Project
AAS Active Antenna System
ADC Analogue-Digital Converter
ADS Advanced Design System (of Keysight Technologies)
BW Bandwidth
DAC Digital-Analogue Converter
dc Direct Current
DFE Digital Front End
DPD Digital Pre-Distortion
EVM Error Vector Magnitude
FB Feedback
HW Hardware
LTE Long Term Evolution
MIMO Multiple Input Multiple Output
MISO Multiple Input Single Output
NL Nonlinear Dynamic
OFDM Orthogonal Frequency Division Multiplex
OPEX Operational Expenditure
PA Power Amplifier
RF Radio Frequency
RFSW Radio frequency software
rms root mean square
SW Software
TX Transmitter
VSWR Voltage Standing Wave Ratio
V2X Vehicle to anything
WCDMA Wideband Code Division Multiple Access
WiFi Wireless Fidelity

BACKGROUND OF THE INVENTION

The radio module efficiency is a key figure for radio products as it relates to: i) the electricity bills (OPEX—operating cost); ii) the volume/size of the radio module (the less efficient operation, the more power to dissipate, the bigger is the required size of the heat sink); iii) the level of energy waste (Green operation classification of products). Hence, maximizing the efficiency is one of the key targets for next generation radio modules. Most of today's radio modules adopt the usage of high efficiency Doherty amplifiers. For future radios, it is required to deliver an optimized Doherty operation using a smart digital Doherty architecture.

Radio module's linearity is a key requirement for radio products in order to fulfil the spectrum emission requirements set by the respective standards (e.g. 3GPP) and authorities and in order to maintain low bit error rate which impact directly the system capacity. For certain applications, radio module linearity is also a key requirements for high capacity systems based on antenna signal processing (i.e., diversity/beamforming). It is important to deliver high radiated output power without increasing challenges on linearization techniques, without increasing the HW/SW complexity of the radio module.

Definition: Domain of Operation

In this application, the baseband complex domain is adopted as the field of operation. Hence, all signals and models used in this report are given in their bandlimited baseband representation (i.e., high order harmonic are not considered). In addition, the systems under consideration are differentiable in their window of operation.

Definition: Multicollinearity

Multicollinearity is a property of a posed system in which some of its model's regressors are highly correlated and endogenous. As a consequence, the estimated coefficients are highly sensitive to small changes in the set of identification data or model structure. Multicollinearity does not reduce the reliability of the model as a whole (black box) over the identification data set, but it affects the validity of the estimated individual regressors' contributions. In other words, the estimated model coefficients do not reflect the individual contribution of the model's independent variables or predictors.

Definition: MISO Systems

A generic Multiple Input Single Output (MISO) system is shown in FIG. 1. It comprises plural (k>1) signal modifiers 1-1 . . . 1-k (such as amplifiers) which each apply a respective non-linear function and/or a respective dynamic function on respective input signals $x_1, \ldots, x_k$. The output from the signal modifiers 1-1 . . . 1-k is combined by combiner 2, in order to obtain an output signal y.

In operation, MISO systems can be of different types, characterized by their input signals and output combiner:
1. Input signals
   a. Equal/Highly correlated
   b. Uncorrelated
2. Output combiner
   a. Isolated (paths independent)
   b. Non-isolated (paths mutually coupled)

Un-correlated signals are signals whose expected value of their projection onto each other's tend to 0 for large number of samples (number of samples of each one of them) tending to infinity. For example, in practice, un-correlation may be proven by determining the projection of at least 100 samples, preferably more than 500 samples, and even more preferably more than 1000 samples on each other. Two signals are considered as un-correlated, if the normalized value of the projection is less than 0.2, preferably less than 0.1, and even more preferably less than 0.01. Here, the normalized value of projection is 1 if the two signals are identical, and 0 if they are completely un-correlated. As an alternative or additional criterion, two signals being un-correlated means that one of them cannot be modeled as a function of the other.

An isolated combiner is any combiner where isolation between its input ports is better than −20 dB, more preferably larger than −30 dB, and still more preferable larger than −40 dB . . . (a non-isolated combiner is any combiner where isolation between its input ports is between −20 dB and 0 dB)

In the following, as an example, a MISO system with 2 inputs $x_1$, $x_2$, whose paths (signal modifiers 1a-1, 1a-2) are characterized by static polynomial parametric models of odd-order up to 3, $f([f_1,f_3], x_1)$ and $g([g_1, g_3], x_2)$, is used for simplicity, as shown in FIG. 2. Here, $f_1$, $f_3$, $g_1$, and $g_3$ are parameters of the respective static polynomials. The approach and derivations are valid and can be generalized for multiple paths with dynamic nonlinear model behaviours (i.e., Volterra-based series, piece-wise generalized memory polynomial approximations) or their simplifications (static linear). Offset or dc contributions from individual paths are not considered.

Independently of the output combiner isolation, the output signal can be written as:

$$y=f([f_1,f_3],x_1)+g([g_1,g_3],x_2)=f_1*x_1+f_3*x_1*|x_1|^2+g_1*x_2+g_3*x_2*|x_2|^2 \quad 1.$$

The Formulation (1) is Valid Under Different Isolation Scenarios:

a. Isolated output combiner: f( ) and g( ) systems are independent. Hence the formulation is always valid; or b. Non-isolated combiner: f( ) and g( ) systems impact each other's behaviour due to mutual coupling at output; hence systems f( ) and g( ), defined respectively by their behavioural model parameters ($f_1$,$f_3$) and ($g_1$, $g_3$), are only valid as an identified pair and as long the relative relation between systems f( ) and g( ) holds. This is true for the following conditions or conditional scenarios:

1. Independent physical changes in system f( ) and/or system g( ) are slower than the identification/adaptation rate; and
2. Inputs $x_1$ and $x_2$ are correlated:
   i. $x_1=F(c, x_2)$, wherein $x_2$ is a generic signal without constraints and c is a complex vector representing the parameters of model F( )→Condition: ∂c/∂t slower than then the identification/adaptation rate; and/or
   ii. $z1=F(e, x)$ and $z2=G(d, x)$, wherein x is a generic signal without constraints, e is a complex vector representing the parameters of model F( ) and d is a complex vector representing the parameters of model G( ). $x1=f(r,z1, z2)$ and $x2=g(s,z1, z2)$ under the condition that dr/dt and ds/dt and de/dt and dd/dt are slower than the identification/adaptation rate and all statistical values of x are captured during the identification window.

Hence, the formulation (1) for scenario b is valid if conditions 1 and 2 are fulfilled.

Hereinafter, a MISO systems with multicollinearity property fulfilling the formulation validity conditions above, and with focus on input signals:

$x_1=c*x_2$, wherein c is a complex coefficient defining linear relation between the input signals to the MISO system, and $x_2$ a generic signal without constraints is mainly considered.

The MISO system described in formulation (1) can be written in matrix form as $$[Y] = [H_1 \ H_2] * \begin{bmatrix} \theta_1 \\ \theta_2 \end{bmatrix} = \begin{bmatrix} x_{1,1} & x_{1,1}*|x_{1,1}|^2 & x_{2,1} & x_{2,1}*|x_{2,1}|^2 \\ \vdots & \vdots & \vdots & \vdots \\ x_{1,N} & x_{1,N}*|x_{1,N}|^2 & x_{2,N} & x_{2,N}*|x_{2,N}|^2 \end{bmatrix} * \begin{bmatrix} f_1 \\ f_3 \\ g_1 \\ g_3 \end{bmatrix}. \quad 2.$$

Y: measured output from MISO system $x_{i,j}$: sample number j of input signal Xi (for this example we have i=1, 2 and j=[1:N] samples)

$$H_i = \begin{bmatrix} x_{i,1} & x_{i,1}*|x_{i,1}|^2 \\ \vdots & \vdots \\ x_{i,N} & x_{i,N}*|x_{i,N}|^2 \end{bmatrix}; \ \theta_1 = \begin{bmatrix} f_1 \\ f_3 \end{bmatrix}; \ \theta_2 = \begin{bmatrix} g_1 \\ g_3 \end{bmatrix};$$

Solving formulation (2) in the Least Square Sense in order to determine $f_1$, $f_3$, $g_1$, and $g_3$ requires inverting the regression matrix $$H^*H = \begin{bmatrix} R_{X_1^*,X_1} & R_{X_1^*,X_1*|X_1|^2} & R_{X_1^*,X_2} & R_{X_1^*,X_2*[X_2]^2} \\ R_{X_1^|X_1|^2,X_1} & R_{X_1^|X_1|^2,X_1*|X_1|^2} & R_{X_1^|X_1|^2,X_2} & R_{X_1^[X_1]^2,X_2*|X_2|^2} \\ R_{X_2^*,X_1} & R_{X_2^*,X_1*|X_1|^2} & R_{X_2^*,X_2} & R_{X_2^*,X_2*|,X_2|^2} \\ R_{X_2^|X_2|^2,X_1} & R_{X_2^|X_2|^2,X_1*|X_1|^2} & R_{X_2^|X_2|^2,X_2} & R_{X_2^[X_2]^2,X_2*|X_2|^2} \end{bmatrix}, \quad 3.$$

Here, H=[H1 H2], * means complex conjugated, and $R_{a,b}$ means the inner product of a and b. $X_i$ is vector notation of input signal i (i is the index of the branch where the input signal is imputed).

For input signals X1=X and X2=c*X, where c is a complex scalar, formulation (3) is written as shown in formulation (4), depicted in FIG. 3.

Formulation (4) which may be re-written as formulation (5):

$$H^*H = [Q_1 Q_2 Q_3 = c^*Q_1 Q_4 = c^*|c|^2 * Q_2],$$

wherein $Q_i$ means the respective column of the matrix in formulation (4).

As may be seen from formulations (4) & (5), columns Q3 and Q4 of the regression matrix are highly correlated to columns Q1 and Q2, respectively. In addition, rows 3&4 of H*H are highly correlated to rows 1 &2. As a consequence, the regression system (4) and, hence, the MISO system (2), for X1=c*X2, is multicollinear, singular and cannot be solved "correctly" for the parametric coefficients (f1, f3) and (g1, g3).

FIG. 4 shows a Matlab example showing the poor identification performance of a MISO system under multicollinearity property (NMSE_estimation=−1.2 dB).

Note: In a posed system with full multicollinearity between its regressors, stabilization techniques by inserting dc offsets on the main diagonal of the correlation regression matrix of the system do not help in estimating the correct parametric coefficients

SUMMARY OF THE INVENTION

It is an object of the present invention to improve the prior art.

According to a first aspect of the invention, there is provided an apparatus, comprising a first number of input ports, each adapted to input a respective input signal, wherein the first number is at least two; a second number of noise generator output ports, each corresponding to a respective different one of the input ports and adapted to provide a respective noise, wherein the second number is one less than the first number or equal to the first number; the second number of mixers, each corresponding to a respective different one of the noise generator output ports and adapted to mix the respective input signal with the respective noise to generate a respective mixed signal; the first number of pre-distorters, each corresponding to a respective different one of the input ports and adapted to apply a respective preliminary pre-distortion on the respective mixed signal if one of the noise generator output ports corresponds to the respective input port and to apply a respective preliminary pre-distortion on the input signal if none of the noise generator output ports corresponds to the respective input port, in order to obtain a respective pre-distorted signal; the first number of signal paths, each corresponding to a respective different one of the input ports and adapted to modify the respective pre-distorted signal in order to obtain a respective modified signal; a combiner adapted to combine the modified signals from the signal paths in order to obtain an output signal; a contribution separator adapted to separate, for each of the input signals, from a feedback signal and based on the respective noise and the respective input signal, a contribution of the respective input signal to the output signal, wherein the feedback signal is based on the output signal; a determinator adapted to determine a respective pre-distortion for at least one of the input signals and to replace the respective preliminary pre-distortion by the respective determined pre-distortion such that, if the determined respective pre-distortion is applied by the respective pre-distorter to the respective mixed signal or input signal, the respective contribution will correspond to the respective input signal on which a predefined function is applied, wherein the predefined function is at least one of non-linear and dynamic and has a third number of predefined parameters.

According to a second aspect of the invention, there is provided an apparatus, comprising a first number of input ports, each adapted to input a respective input signal, wherein the first number is at least two; the first number of pre-distorters, each corresponding to a respective different one of the input ports and adapted to apply a respective preliminary pre-distortion on the respective input signal in order to obtain a respective pre-distorted signal; a second number of noise generator output ports, each corresponding to a respective different one of the input ports and adapted to provide a respective noise, wherein the second number is one less than the first number or equal to the first number; the second number of mixers, each corresponding to a respective different one of the noise generator output ports and adapted to mix the respective pre-distorted signal with the respective noise to generate a respective mixed signal; the first number of signal paths, each corresponding to a respective different one of the input ports and adapted to modify the respective pre-distorted signal if none of the mixers corresponds to the respective input port and to modify the mixed signal if one of the mixers corresponds to the respective input port, in order to obtain a respective modified signal; a combiner adapted to combine the modified signals from the signal paths in order to obtain an output signal; a contribution separator adapted to separate, for each of the input signals, from a feedback signal and based on the respective noise and the respective input signal, a contribution of the respective input signal to the output signal, wherein the feedback signal is based on the output signal; a determinator adapted to determine a respective pre-distortion for at least one of the input signals and to replace the respective preliminary pre-distortion by the respective determined pre-distortion such that, if the determined respective pre-distortion is applied by the respective pre-distorter to the respective input signal, the respective contribution will correspond to the respective input signal on which a predefined function is applied, wherein the predefined function is at least one of non-linear and dynamic and has a third number of predefined parameters.

For the apparatus of each of the first and second aspects, one or more of the following may apply:

At least one of the signal paths may comprise an amplifier.

At least one of the determinators may be adapted to, for the respective input signal, determine the third number of actual parameters of the predefined function by fitting the predefined function to the respective contribution, and to determine the respective pre-distortion by inverting the predefined function with the third number of actual parameters.

The combiner may be isolated, or the combiner may be non-isolated.

The predefined function may be one of a polynomial of an order of two, or three, or four, or five, or higher, a polynomial with memory, and a piece-wise combination of the polynomials and/or the polynomials with memory.

The noise generator output ports may be adapted such that each of the noises is not correlated to each of the other ones of the noises, or such that each of the noises is substantially not correlated to each of the other ones of the noises.

Each of the noises may be at least one of random noise and impulsive noise.

The determined pre-distortion may adjust a path of one input signal relative to at least one other path of another one of the input signals.

At least one of the combiner, the contribution separator, and the determinator may be implemented as a passive circuit.

According to a third aspect of the invention, there is provided a method, comprising inputting respective input signals into a first number of input ports, wherein the first number is at least two; providing respective noises at a second number of noise generator output ports, wherein each noise generator output port corresponds to a respective different one of the input ports, and the second number is one less than the first number or equal to the first number; mixing each of noises with the respective input signal to generate a respective mixed signal; applying a respective preliminary pre-distortion on each of the mixed signals and applying a respective preliminary pre-distortion on the input signal if it is not mixed with any of the noises, in order to obtain pre-distorted signals; inputting each of the pre-distorted signals into a respective different signal path adapted to modify the respective pre-distorted signal in order to obtain a respective modified signal; combining the modified signals from the signal paths in order to obtain an output signal;

separating, for each of the input signals, from a feedback signal and based on the respective noise and the respective input signal, a contribution of the respective input signal to the output signal, wherein the feedback signal is based on the output signal; determining a respective pre-distortion for at least one of the input signals and to replace the respective preliminary pre-distortion by the respective determined pre-distortion such that, if the determined respective pre-distortion is applied to the respective mixed signal or input signal, the respective contribution will correspond to the respective input signal on which a predefined function is applied, wherein the predefined function is at least one of non-linear and dynamic and has a third number of predefined parameters.

According to a fourth aspect of the invention, there is provided a method, comprising inputting respective input signals into a first number of input ports, wherein the first number is at least two; applying a respective preliminary pre-distortion on each of the input signals in order to obtain a pre-distorted signals; providing a respective noise at a second number of noise generator output ports, wherein the second number is one less than the first number or equal to the first number, and each noise generator output port corresponds to a different one of the input ports; mixing each of the noises with the respective pre-distorted signal to generate mixed signals; inputting each of the mixed signals into a respective signal path and inputting the pre-distorted signal into a respective signal path if the pre-distorted signal is not mixed with any of the noises, wherein each of the signal paths is adapted to modify the respective mixed signal and pre-distorted signal, respectively, in order to obtain modified signals; combining the modified signals from the signal paths in order to obtain an output signal; separating, for each of the input signals, from a feedback signal and based on the respective noise and the respective input signal, a contribution of the respective input signal to the output signal, wherein the feedback signal is based on the output signal; determining a respective pre-distortion for at least one of the input signals and to replace the respective preliminary pre-distortion by the respective determined pre-distortion such that, if the determined respective pre-distortion is applied to the respective input signal, the respective contribution will correspond to the respective input signal on which a predefined function is applied, wherein the predefined function is at least one of non-linear and dynamic and has a third number of predefined parameters.

For the method of each of the third and fourth aspects, one or more of the following may apply:

At least one of the signal paths may comprise an amplifier.

The determining of at least one of the pre-distortions may comprise determining the third number of actual parameters of the predefined function by fitting the predefined function to the respective contribution, and determining the respective pre-distortion by inverting the predefined function with the third number of actual parameters.

The modified signals may be combined by an isolated combiner, or the modified signals may be combined by a non-isolated combiner.

The predefined function may be one of a polynomial of an order of two, or three, or four, or five, or higher, a polynomial with memory, and a piece-wise combination of the polynomials and/or the polynomials with memory.

Each of the noises may not be correlated to each of the other ones of the noises, or each of the noises may substantially not be correlated to each of the other ones of the noises.

Each of the noises may be at least one of random noise and impulsive noise.

The determined pre-distortion may adjust a path of one input signal relative to at least one other path of another one of the input signals.

At least two of the input signals may be correlated with each other.

Each of the methods may be a method of providing feedback.

According to some example embodiments of the invention, at least one of the following technical effects may be provided:

Simplified HW architecture with reduced number of output interfaces, feedback networks and elimination of RF switch and its control;

Optimized RF performance due to better linearization and/or better relative behavioral operation and/or better efficient operation;

Boosted system efficiency for both isolated and not isolated power combiners;

Real-time optimized RF performance;

Ability to handle sample-to-sample variations, deviations in lineup during production and variations due to deviations in operating conditions.

Prompt reaction and adaptation to fast and sudden changes in the operating conditions by using single-shot identification of the combined output. Conventionally, this was not possible due to time constraints.

BRIEF DESCRIPTION OF THE DRAWINGS

Further details, features, objects, and advantages are apparent from the following detailed description of example embodiments of the present invention which is to be taken in conjunction with the appended drawings, wherein FIG. 1 shows a conventional MISO system;

FIG. 2 shows a conventional MISO system with two input paths;

FIG. 3 shows formulation 4;

FIG. 4 shows a Matlab example for solving a conventional MISO system;

FIG. 6 shows formulation 6;

FIG. 7 shows formulation 7;

FIG. 8 shows formulation 8;

FIG. 9 shows formulation 9;

FIG. 10 shows formulation 10;

FIG. 11 shows a Matlab simulation according to an example embodiment of the invention;

DETAILED DESCRIPTION OF CERTAIN EXAMPLE EMBODIMENTS

Herein below, certain example embodiments of the present invention are described in detail with reference to the accompanying drawings, wherein the features of the example embodiments can be freely combined with each other unless otherwise described. However, it is to be expressly understood that the description of certain embodiments is given for by way of example only, and that it is by no way intended to be understood as limiting the invention to the disclosed details.

Moreover, it is to be understood that the apparatus is configured to perform the corresponding method, although in some cases only the apparatus or only the method are described.

Some embodiments of the invention are of high relevance for radio modules using high efficiency architectures such as Digital Doherty or Outphasing; using Coherent power combining; and for the linearization and architecture design of radio modules based on multiple TX pipes.

Some embodiments of the invention overcome the multicollinearity property of a posed MISO system with linearly correlated generic inputs, which will help in identifying and separating the behavioral contribution of each branch of the MISO system. Thus, simplifications and optimizations of radio module's amplification architectures are achieved as detailed further below.

Figure 5:
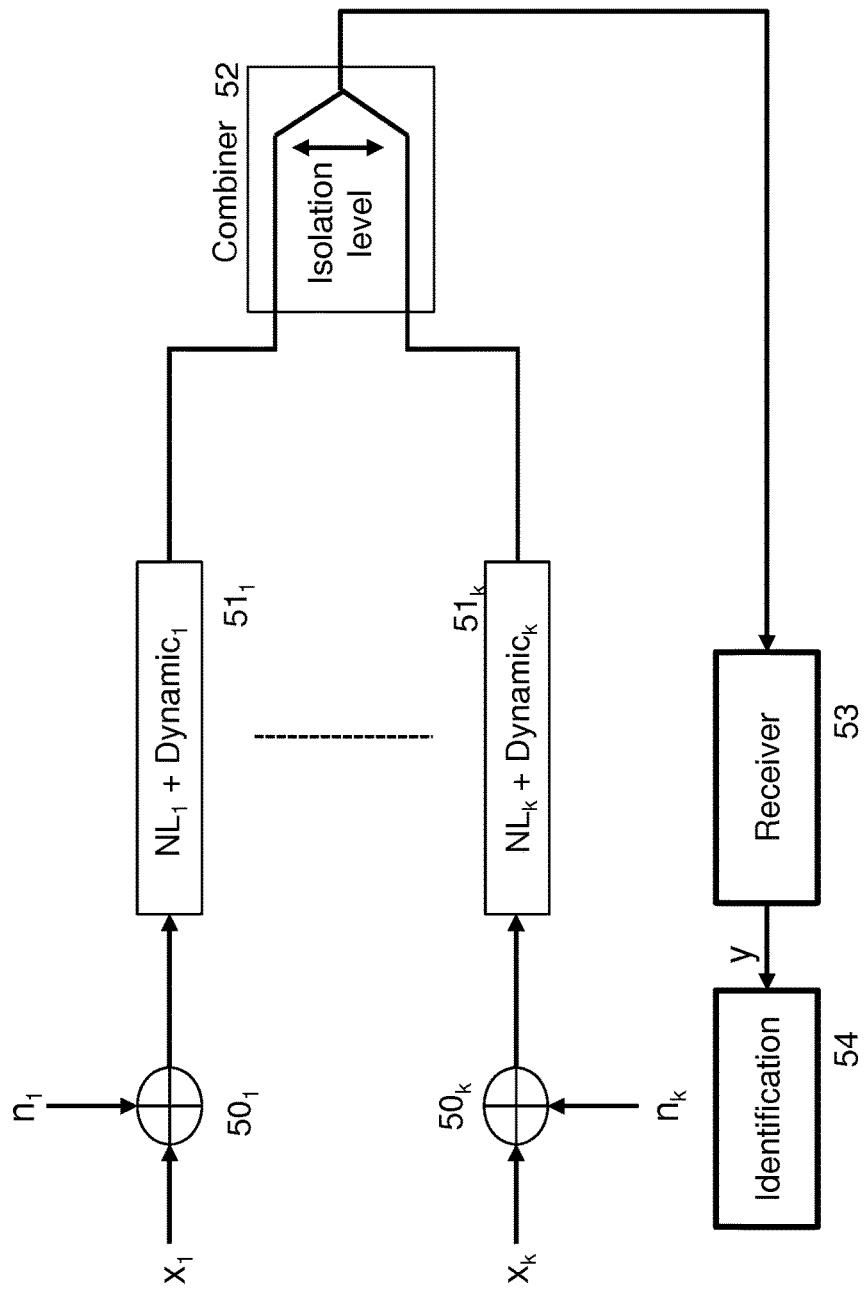
FIG. 5 shows a MISO system according to an embodiment of the invention.

In order to break the multicollinearity property of the correlation matrix system in (3)-(5), uncorrelated and low power noise patterns are transmitted in each input branch of the MISO system in parallel to the information signals, as depicted in FIG. 5.

According to FIG. 5, input signals $x_i$ (i=1, . . . , k; k≥2) are mixed with respective un-correlated noise sequences $n_i$ in mixers $50_i$. The noise level is much smaller than the smallest signal level, that is: $rms(n_i), \ldots, rms(n_k) \ll min(rms(x_i))$.

The noise generators may be arbitrary as long it is ensured that the noises added to the different paths are substantially uncorrelated. Preferably, the noises are completely uncorrelated. However, since ensuring complete uncorrelation requires some effort, it is sufficient that the correlation between different noises is less than −10 dB, preferably less than −15 dB, more preferably less than −20 dB compared to autocorrelation of any of these noise sequences. As another option, substantial uncorrelation may be achieved if the noises are generated independently from each other. For example, in each path, the noise may be generated by delaying its respective input signal by an arbitrary delay time (and reducing its power). Also, the noises may be generated by respective different delays on a random (or pseudo-random) signal sequence for each of the branches. The (substantially) un-correlated noises may be generated by one or more noise generators.

The noise may be white noise (i.e. having a flat spectrum over frequency). Alternatively, the noise may be colored noise which is spectrally shaped. For example, colored noise may be generated by filtering white noise, e.g. to reflect some spectral emission mask.

For each of the input branches, the bandwidth of the noise sequences should preferably be bigger than the instantaneous bandwidth of the respective information signal $x_i$. The rms power all noise sequences is less or preferably much less than a minimum of all signal rms powers (i.e. <−20 dBc with respect to signal level (preferably <−30 dBc, more preferably <−40 dBc) for the following reasons:

a. Not to impact the error vector magnitude (EVM) and, hence, the information fidelity; and
 b. Not to impact the nonlinear behaviour of the system triggered solely by the excitation signals.

On the other hand, the added noise sequences should have a minimum rms power which is sufficient in order to split the noise-added signals from each other in a reasonable time and with sufficient accuracy. Therefore, it should be preferably at least 1% of the maximum of all signal rms powers, more preferably at least 5% of the maximum, and still more preferably at least 10% of the maximum.

In the signal paths $51_i$, a respective non-linear function $NL_i$ and/or a dynamic function $Dynamic_i$ is applied to each of the mixed signals. The signals from the signal paths are combined in the combiner 52, which may be isolated or not-isolated, depending on the isolation level (see above).

The receiver 53 receives a feedback signal which is based on an output of the combiner 52. For example, the feedback signal may be the output of the combiner itself, a split fraction thereof, or a feedback signal taking into account reflection on a transmission line connected to the output port of the combiner 52. The receiver 53 may convert the received feedback signal into the digital domain if the identifier 54 is implemented as a digital circuit (note that at least part of the signal paths $51_i$ and the combiner 52 belong to the analogue domain, whereas the input signals $x_i$ and noise sequences $n_i$ are typically digital signals; illustration of ADC and DAC are omitted in the present figures for simplicity).

As will be outlined in detail further below, the identifier 54 identifies the contributions of each path to the feedback signal and determines a pre-distortion which may be applied to one of the input signals $x_i$ (preferably a respective pre-distortion will be determined for each of the input signals) in order to ensure that the contribution of the respective input signal to the output of the combiner 52 corresponds to the input signal, on which a predefined function (reflecting a certain behavior of $NL_i$ and $Dynamic_i$) is applied.

As a result of the noise sequences insertion, formulation (3) of system equation (1) is written as formulation 6, shown in FIG. 6. Here, as above, H=[H1 H2], * means complex conjugated, and $R_{a,b}$ means the inner product of a and b.

For X1=X and X2=c*X, formulation (6) leads to formulation 7, shown in FIG. 7.

In addition, for large number of samples and for $rms(N_i) \ll min(rms(X_i))$, $|X_i+N_i|^2 \approx |X_i|^2$, which leads to the simplified formulation 8, shown in FIG. 8.

Thus, the correlation matrix H*H may be re-written as shown in formulation 9, depicted in FIG. 9, wherein $F_1$ to $F_4$ are defined as shown in formulation 10, depicted in FIG. 10, and wherein $Q_{i,j}$ are obtained from formulations (4) and (5) of the explanation of the conventional MISO system without noise addition.

As shown by formulation (9) and (10), a linear relation exists neither between the columns of the correlation regression matrix nor between its rows, due to the additional noise-related terms. As a result, it is possible to solve correctly the linear system of equations for the parametric coefficients (f1, f3) and (g1, g3) of the MISO system described in (1)-(2) using standard least square solutions (fitting):

$$\hat{\theta} = (H^*H)^{-1}H^*y. \qquad \text{(formulation 11)}$$

The contribution of each pipe can then be calculated as:

$$\hat{y}_i = H_i * \hat{\theta}_i. \quad \text{(formulation 12)},$$

wherein ^ in formulations (11) and (12) means that the respective value is estimated according to the fitting. In particular cases, the system of equations for the parametric coefficients (f1, f3) and (g1, g3) of the MISO system may be solved even analytically.

To the knowledge of the inventors, this is the first closed-solution which identifies and approximates the individual contributions of a generic MISO system fulfilling the Formulation (1) validity conditions.

FIG. 11 shows a Matlab example showing the identification performance of a MISO system under multicollinearity property when noise insertion in used. The much lower value of NMSE_estimation (−146.55 dB) shows that the identification performance is much better than in the conventional case (FIG. 4) without noise added.

Also, an ADS-Matlab co-simulation was made for a system with two input branches into which uncorrelated signals were input and combined by a combiner of only −6 dB isolation (a non-isolated combiner). Based on the output signal (i.e., the combined signal of the two branches), the contributions of each of the input branches to the output signal were calculated and the related parameters $f_1$, $f_2$, $g_1$ and $g_2$ were determined using the above described formulations (10) to (12). Then the pre-distortion of one of the branches in order to compensate for the distortions of this branch and the combiner was adapted, while the other branch remained unmodified. Antipodal signals were input into the branches 1 and 2. The resulting output signal with the correspondingly adapted pre-distortion had more than 45 dB cancellation, which shows that the signal separation of paths 1 and 2 was successful.

Based on this insight, embodiments of the invention provide e.g. RF coherent power combining with common digital pre-distortion feedback path and optimized power combiner. This solution may be preferably hardware based. In such embodiments, the feedback at the output of the combiner is measured which allows to identify and compensate for the output combiner in the linearization stages (e.g. the DPD). In conventional solutions, this was not possible and feedbacks were placed before the output combiner.

Figure 12:
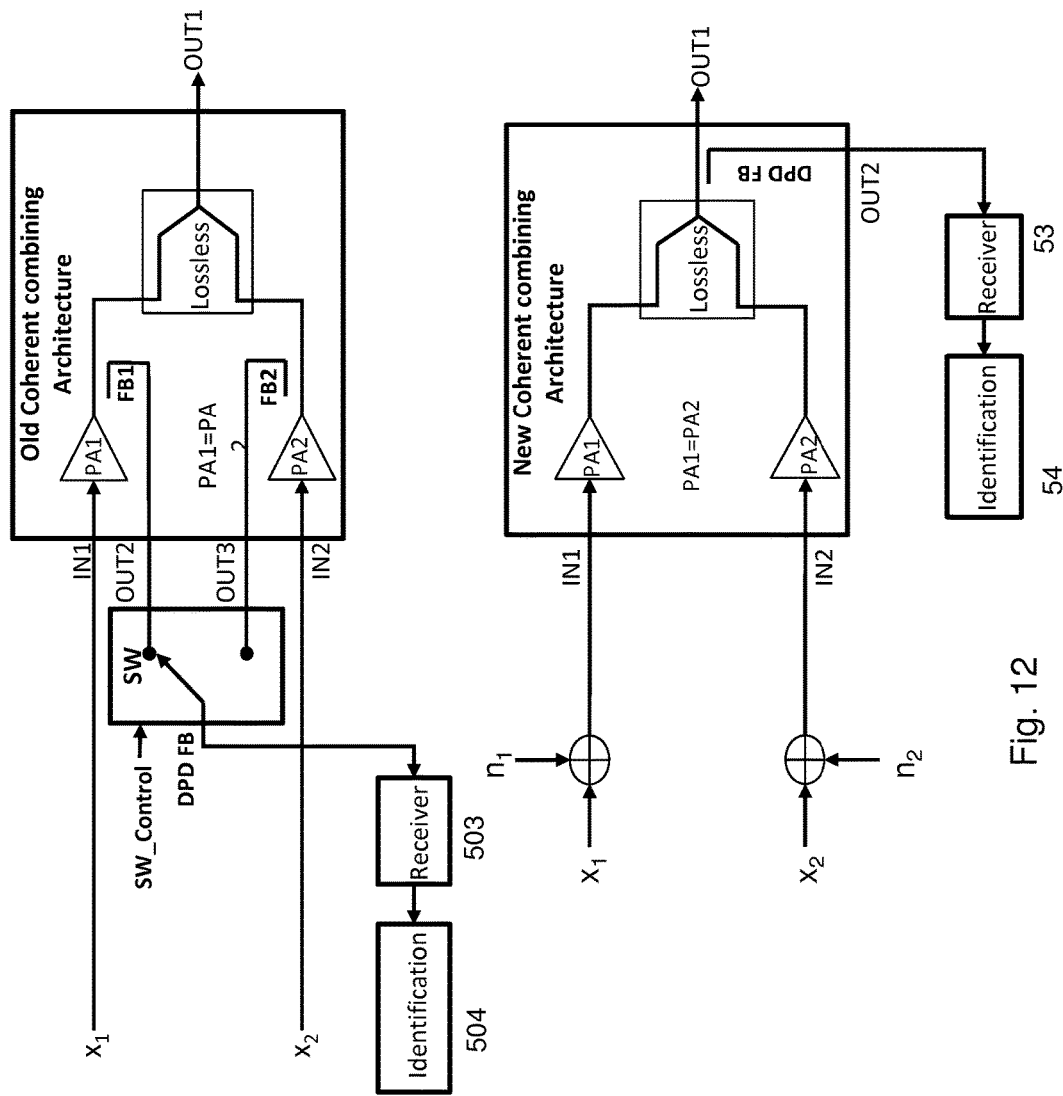
FIG. 12 compares a conventional MISO system (top part) with a MISO system according to an example embodiment of the invention (bottom part)

FIG. 12 sketches a combining architecture according to an embodiment of the invention (top part) and compares it with the conventional architecture (bottom part). In the conventional architecture, feedback is obtained after the respective PAs, but before the combiner. The feedback from the two paths is switched (multiplexed) by a RF switch SW. Thus, the conventional receiver 503 and identifier 504 need not to split the contributions of the different input signals to the output signal.

In contrast thereto, according to some embodiments of the invention, only one feedback is obtained after the combiner. The contributions of the different paths are separated as outlined hereinabove (by the receiver 53 and identifier 54, which may correspond to those of FIG. 5). Note that the receiver 53 and identifier 54 (i.e. the components following the combiner 52 until the component determining the appropriate pre-distortion) may be fully or partly implemented as passive circuits, which do not requires switches as according to the prior art.

Thus, at least the following advantages are achieved:
Simplified HW architecture with reduced number of output interfaces, feedback networks and elimination of RF switch and its control Estimation and individual linearization of the amplification paths at the combining node which optimize the RF performance Usage of optimized lossless power combining architecture (isolated or not isolated) to boost the system efficiency Prompt reaction and adaptation to fast and sudden changes in the operating conditions by using single-shot identification of the combined output. Conventionally, this was not possible due to time multiplexing of feedback network and receiver.

The advantage in terms of simplified hardware and software architecture becomes even more apparent if the number of input branches is increased.

Figure 13:
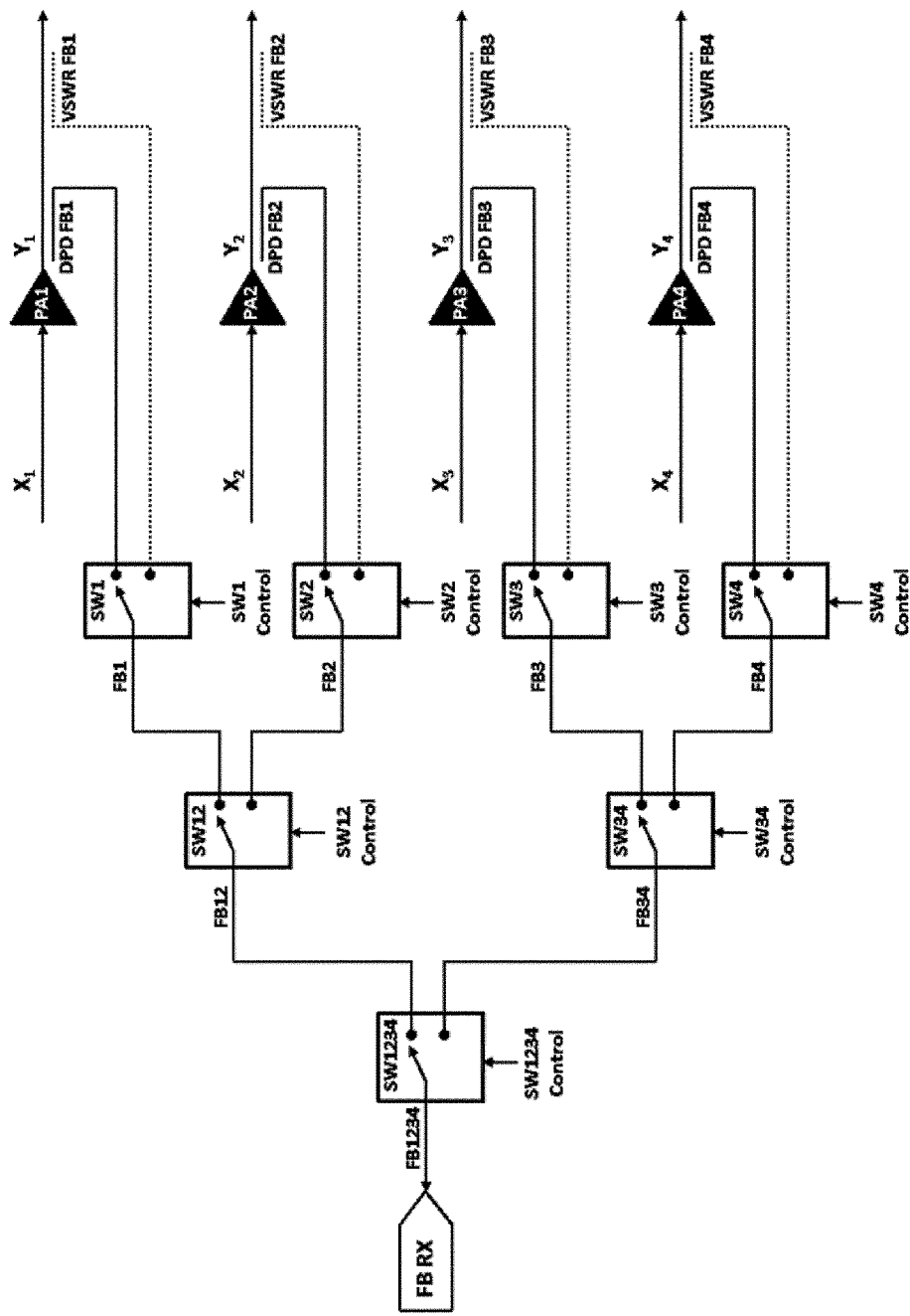
FIG. 13 shows a feedback architecture of a conventional MISO architecture.

FIG. 13 shows a feedback architecture according to a conventional MISO architecture with four input branches. That is, FIG. 13 does not show the complete feedback path but only how the feedback signal at the feedback receiver FB RX is generated from the output signals of the amplifiers.

Conventionally, the feedback is obtained from the output signals of the amplifiers before they are combined by the combiner. Thus, in the present case, four feedbacks per feedback type are obtained. There may be more than one feedback type such as DPD FB and VSWR FB, both shown in FIG. 13.

As shown in FIG. 13, one feedback receiver is time-multiplexed between 8 feedback inputs from the 4 pipes. 7 RF switches needs to be controlled by the RFSW based on which functionality to observe in which pipe.

Time-multiplexing the feedback receiver puts high constraints on the reaction and adaptation time of the radio module system to fast and severe changes in the operating conditions, which can result in deviation from the target performance.

Using an excessive amount of RF switches and their controllers increases the complexity of the HW architecture, which contradicts with the high integration design trends, leads to accumulated consumed power which can impact the radio module efficiency, and increases the SW complexity due to controlling a large number of switches.

Such architecture complexity doubles with doubling the number of TX-pipes. Hence, it raises large design challenges for future products supporting massive MIMO or high order beamforming.

In addition, combining several feedbacks in a MISO structure and measuring them instantaneously for the purpose of identification cannot be performed due to the high probable existence of linear correlation between the transmitted signals. Such linear correlation leads to high multicollinearity when identifying the combined feedbacks, which results in erroneous estimation of the individual branches of the feedback MISO system. Hence, conventionally, it is not possible to separate the contributions of the input branches.

Figure 14:
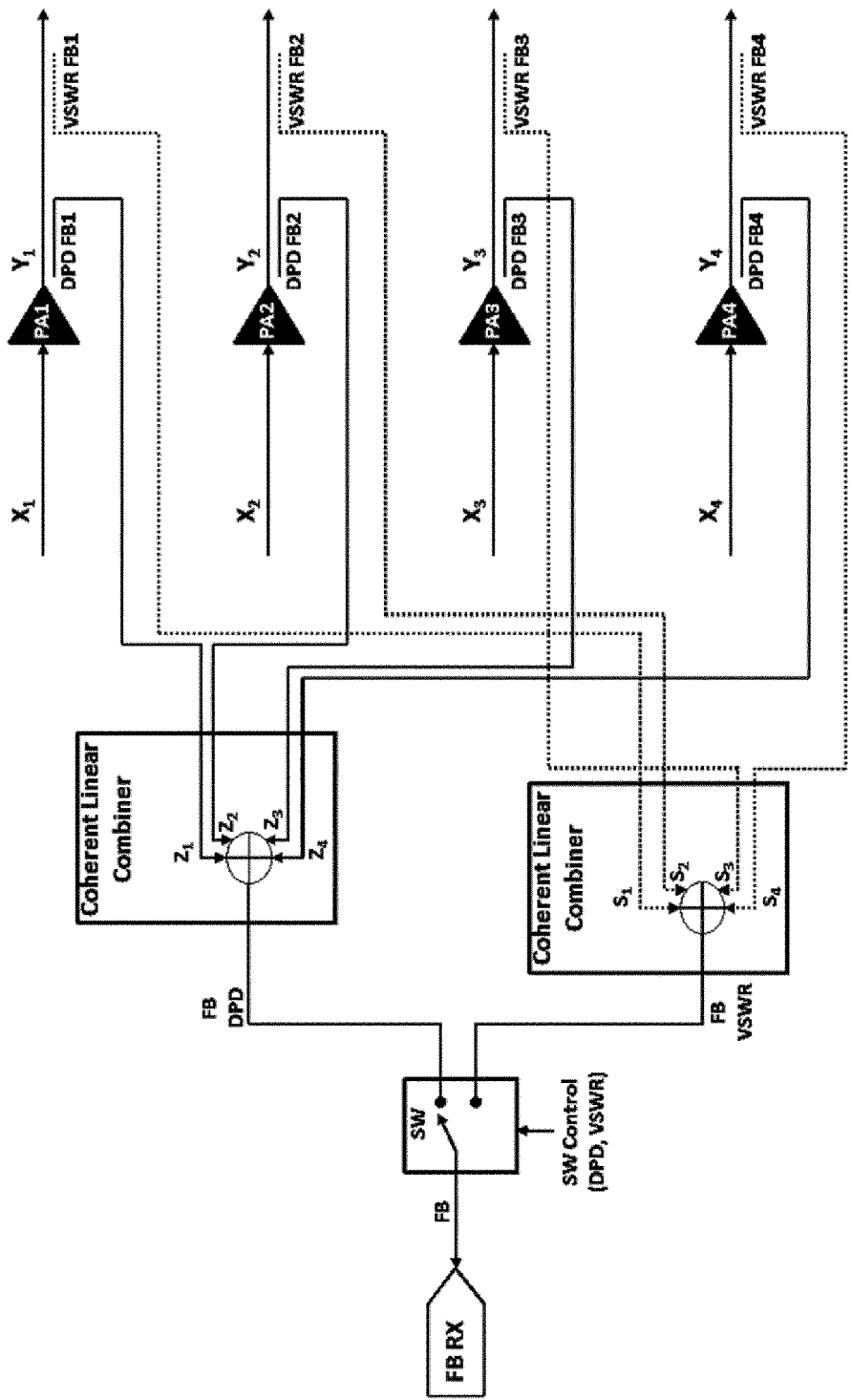
FIG. 14 shows a feedback architecture according to a MISO system according to an example embodiment of the invention.

FIG. 14 shows a corresponding feedback architecture for a MISO system according to some embodiments of the invention. In FIG. 14, the inputs $X_1$ to $X_4$ are input signals to which the noise sequences are added, as discussed hereinabove. In this example, the feedback signals of each type (DPD, VSWR) are combined by a respective combiner, and the feedback paths are time multiplexed between the different types by a single switch SW. That is, the number of switches is reduced from 7 in the conventional architecture to 1 according to some embodiments of the invention.

In the feedback receiver FB RX, the contributions of the branches 1 to 4 are split as outlined hereinabove based on the input signals and the known noise sequences.

Note that, in the example of FIG. 14, the combining of the feedback signals is done separately from the combining of the output signals of the amplifiers PA1 to PA4 by which the output signal of the MISO system is obtained. Thus, the combiners may be adapted appropriately to the different signal levels of the feedback signals and the output signals.

According to some embodiments of the invention, self-learning behavior and performance of Digital Doherty amplification architectures is improved by estimating the individual contributions of the main and peak amplifiers at the combining node.

The Doherty amplification architecture consists of a main amplifier in parallel with a peak amplifier. The input signal is split to drive the two amplifiers, and a combining network sums the two output signals of the amplifiers. Namely, during periods of low signal level, the main amplifier efficiently operates on the signal and the peak amplifier is cutoff and consumes little power. During periods of high signal level, the main amplifier delivers its maximum power and the peak amplifier delivers up to its maximum power, depending on the level of the input signal.

By estimating the contributions of main and peak at combiner node, the relation between the transmitted signals may be optimized during operation. Thus, ideal combining and hence optimal RF performance and efficiency may be achieved. In addition, the method according to some embodiments of the invention is robust to non-idealities caused during production and operation and which may impact drastically the system performance. Such identification and optimization was not possible in conventional solutions.

Figure 15:
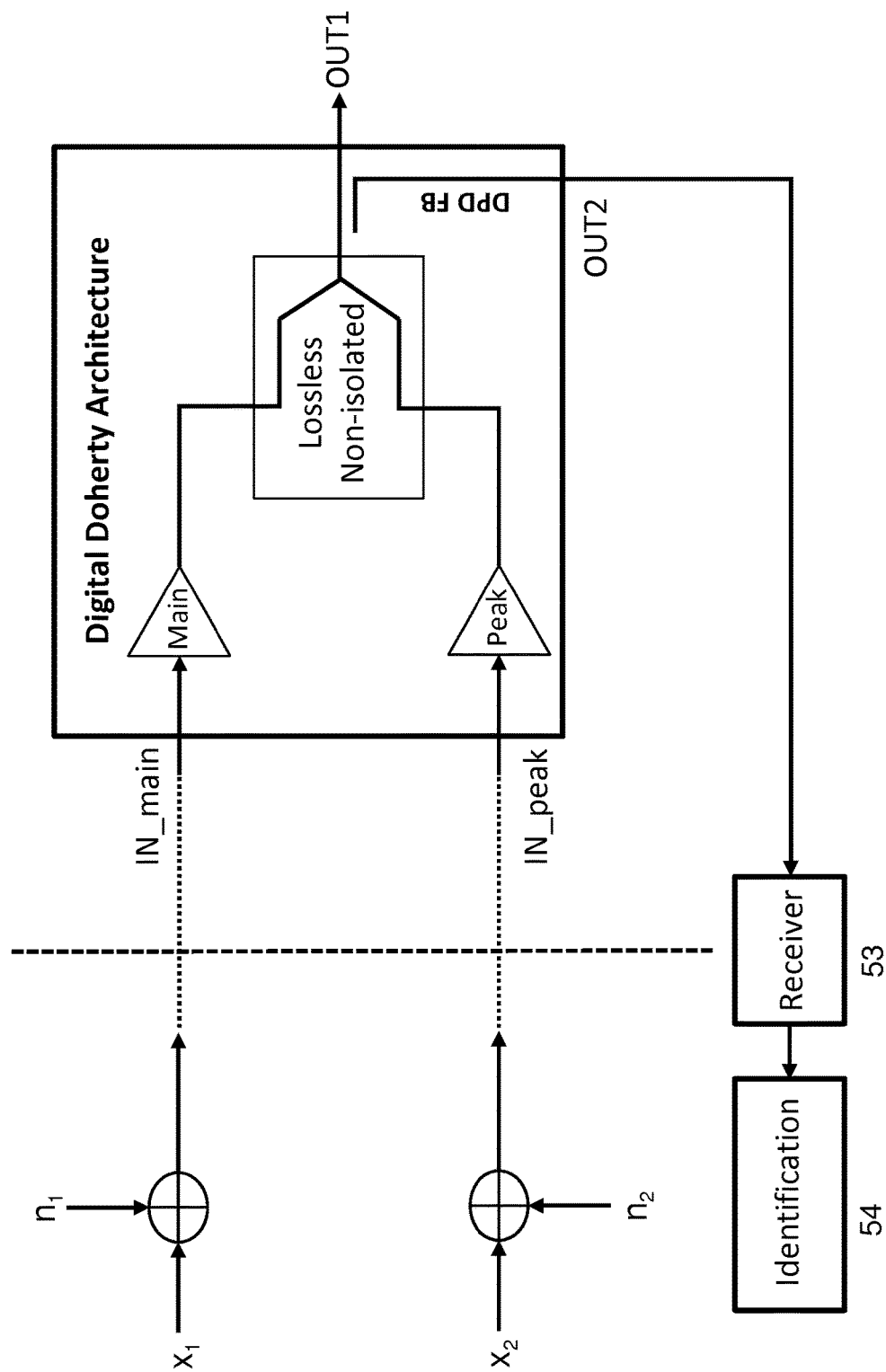
FIG. 15 shows a MISO system according to an example embodiment of the invention.

A generic block diagram of digital Doherty architecture with noise insertion is presented in FIG. 15. It corresponds substantially to those of FIG. 5 and FIG. 12 (bottom part), wherein the two amplifiers are "main" and "peak", and the combiner is non-isolated. In FIG. 15, the part left of the dashed line is digital, and the part right thereof is analogue. The receiver 53 performs analogue-digital conversion.

This architecture has at least the following advantages over a conventional digital Doherty architecture:

Real-time optimized RF performance versus frequency and power of the individual amplifiers and of the overall Doherty architecture;

Ability to handle sample-to-sample variations, deviations in line-up during production and variations due to deviations in operating conditions. This improves production yield and maintain performance during life time due to online identification and adaptation of main and peak individual behaviors.

Relaxation in linearization performance when needed. Namely, it allows adjusting the individual behavior of the amplifiers (Main and Peak) to improve the linearity of the Doherty output even without having a Doherty linearizer.

A corresponding architecture may be applied to conventional outphasing architectures.

If the MISO system has M input branches, according to some embodiments of the invention, respective noises are added to M−1 branches or to M branches. In the former case, from a formal point of view, the branch without noise addition receives "zero noise" which is completely unrelated to all other noises.

According to some embodiments of the invention, one or both of two types of noise patterns may be mixed with the input signals: random noise and impulsive noise. Each of them has different characteristics, for example:

a. Random noise:
   i. Noise bandwidth: $BW_{signal} < BW_{noise} < BW_{DPD}$
   ii. Noise shape: white noise with uniformed spectrum; spectrally shaped
   iii. Noise rms level: <−20 dBc with respect to signal level (preferably <−30 dBc, more preferably <−40 dBc)
   iv. The impact of the random noise on the EVM should be minimal b. Impulsive noise:
   i. Duration<<OFDM symbol (e.g. 2%, 5%, or 10% of the duration of the OFDM symbol)
   ii. Position in time and frequency domain at different relative locations between the MISO branches
   iii. Pulse level should not increase the signal peak to average ratio in worst statistical case. E.g., pulse level should not increase the signal peak to average ratio in 98% of the time (worst statistical case of coherent adding between signal envelope and impulse should be <2%). In some embodiments, 96% or 99% of the time are considered instead of 98%.
   iv. The impact of the impulse noise on the EVM should be minimal According to some embodiments of the invention, the feedback is permanently evaluated and the linearization (pre-distortion) accordingly adapted. However, in some embodiments of the invention, the feedback is evaluated from time to time (e.g. periodically) and/or event based, e.g. due to temperature changes or if a certain traffic pattern (such as a peak) occurs.

Figure 16:
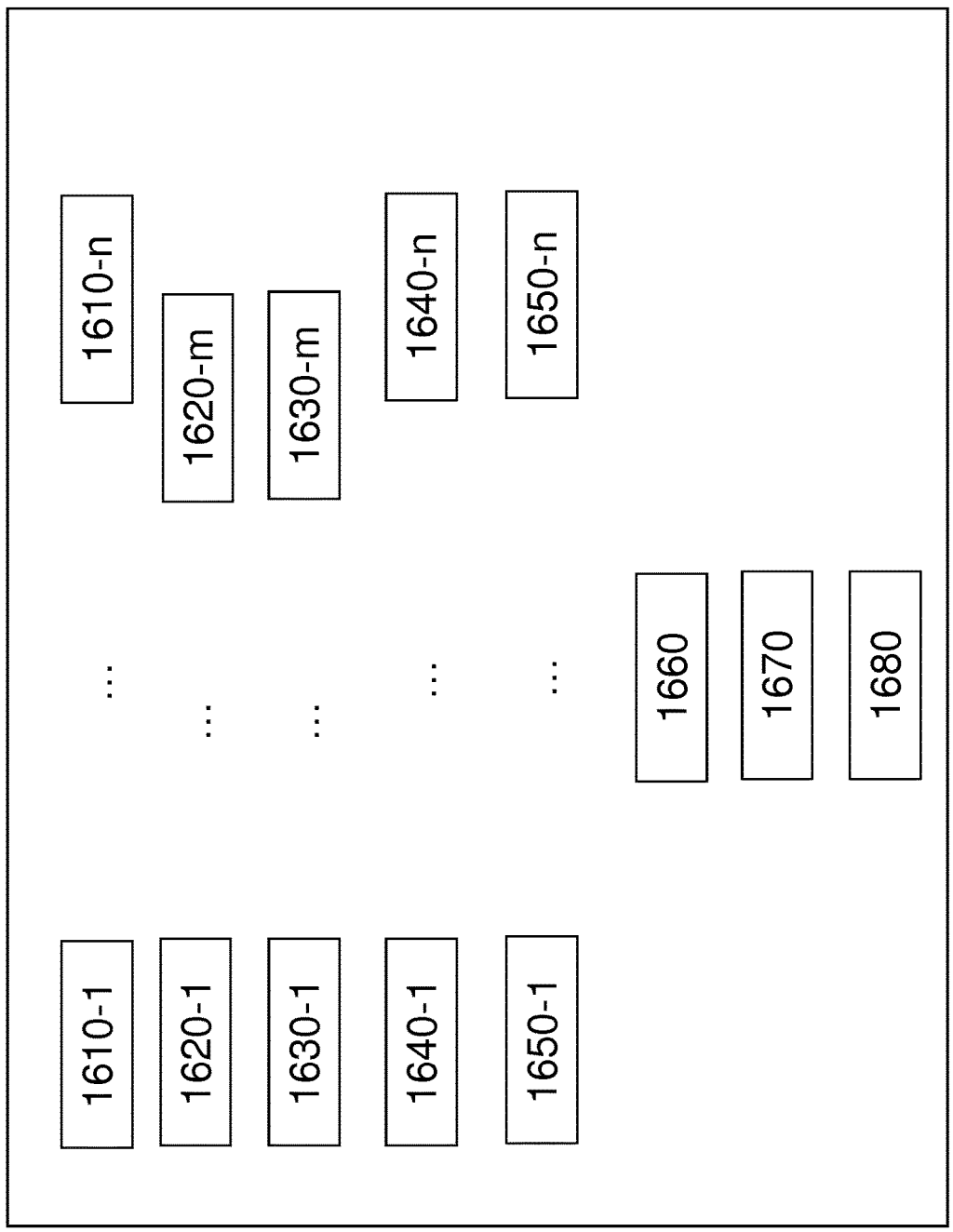
FIG. 16 shows an apparatus according to an example embodiment of the invention.
Figure 17:
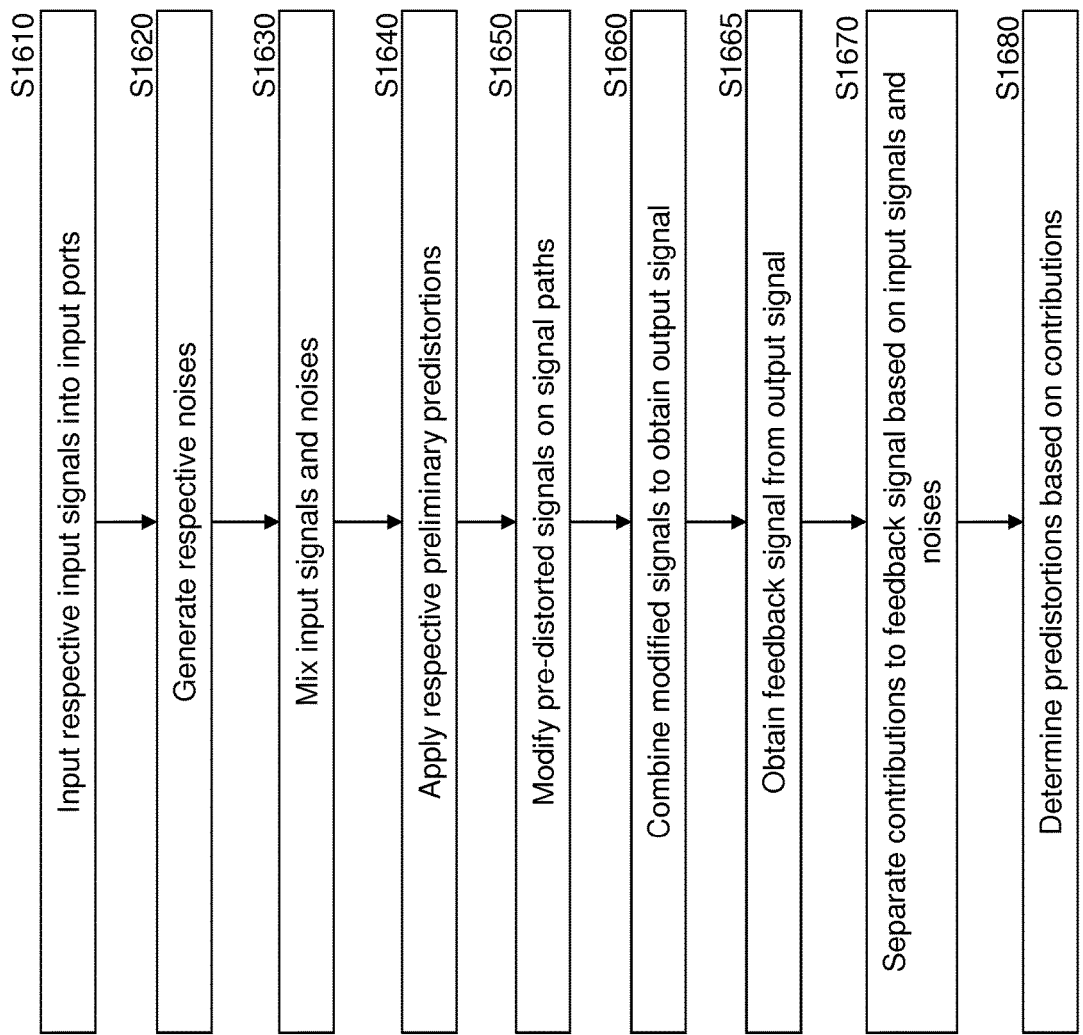
FIG. 17 shows a method according to an example embodiment of the invention.

FIG. 16 shows an apparatus according to an example embodiment of the invention. The apparatus may be a MISO architecture, or an element thereof. FIG. 17 shows a method according to an example embodiment of the invention. The apparatus according to FIG. 16 may perform the method of FIG. 17 but is not limited to this method. The method of FIG. 17 may be performed by the apparatus of FIG. 16 but is not limited to being performed by this apparatus.

The apparatus comprises n (n≥2) input ports 1610-1 to 1610-n, m (m=n or m=n−1) noise generator output ports 1620-1 to 1620-m, m mixers 1630-1 to 1630-m, n pre-distorters 1640-1 to 1640-n, n signal paths 1650-1 to 1650-n, a combiner 1660, a contribution separator 1670, and a determinator 1680. In the following description, the indices ("−1" to "−n" and "−m", respectively) are omitted if the description applies to all of the respective entities.

A respective input signal is input into each input port 1610 (S1610).

The noise generator output ports 1620 provide different noises which are preferably uncorrelated or substantially uncorrelated (S1620). That is, the conditions discussed hereinabove should preferably apply to the noises. The noises provided by the noise generator output ports 1620 may be generated by one or more noise generators.

The mixers mix the respective noises with the respective input signals (S1630). I.e., each noise is mixed with a different one of the input signals. Thus, mixed signals are generated.

The mixed signals and, if one of the input signals is not mixed with a respective noise, this input signal are each input in a respective pre-distorter 1640. The pre-distorter applies a respective preliminary pre-distortion on the respective mixed signal and input signal, respectively, in order to obtain a respective pre-distorted signal (S1640). The pre-distortion aims at linearization of the output signal.

The pre-distorted signals are given on the respective signal paths 1650. The signal paths may modify the pre-distorted signals (S1650). E.g., a signal path may comprise at least one of an amplifier, an attenuator, and a phase shifter which modify the respective pre-distorted signal.

The combiner 1660 combines the modified signals from the signal paths in order to obtain an output signal (S1660). The combiner may additionally modify the output signal, e.g. due to distortions at the combining.

A feedback signal is obtained from the output signal (S1665). For example, the feedback signal may be the same as the output signal. The feedback signal may be a DPD feedback or a VSWR feedback.

The contribution separator (1670) separates from the feedback signal for each of the input signals, based on the respective noise and the respective input signal, a respective contribution of the input signal to the output signal (S1670). For this, the contribution separator according to some embodiments of the invention applies the algorithm outlined hereinabove. That is, the contribution separator fits the model of the noise generators, the signal paths including the pre-distorters and the combiner to the actual output signal as close as feasible, i.e., until a sum of least squares is less than a predefined threshold (least square criterion).

The determinator 1680 determines a respective pre-distortion for at least one of the input signals and replaces the respective preliminary pre-distortion by the determined pre-distortion (S1680). The pre-distortion is determined such that, if the determined respective pre-distortion is applied to the respective input signal, the respective contribution will (substantially) correspond to the respective input signal on which a predefined function is applied. I.e., the pre-distortion is set such that the output of the combiner 1660 is such as if the signal path 1650 and the combiner 1660 (without the pre-distorter 1640) were nearly ideal, wherein a combination of an ideal signal path and an ideal combiner would, if the input signal is input, output the input signal on which the pre-defined function is applied. The predefined function is at least one of non-linear and dynamic and has an arbitrary number of predefined parameters.

Depending on the implementation or on a configuration, the determinator 1690 may determine the determined pre-distortion such that the contribution of the input signal is such that the input signal with or without the mixed noise is input into the ideal signal path and ideal combiner. Typically, the results of these determinations are not much different because the noise level should be much smaller than the signal level (see above).

In some embodiments of the invention, the sequence of noise mixing (S1630) and pre-distortion (S1640) may be inverse to that described hereinabove. I.e., in these embodiments, the input signal is pre-distorted first and then, a respective noise is mixed to all (or all but one) pre-distorted input signals. The mixed signals (and the one pre-distorted signal to which a noise is not mixed, as the case may be) are then input into the signal paths. In these embodiments, the remaining parts of the apparatus of FIG. 16 and the method of FIG. 17 are adopted as described before.

Figure 18:
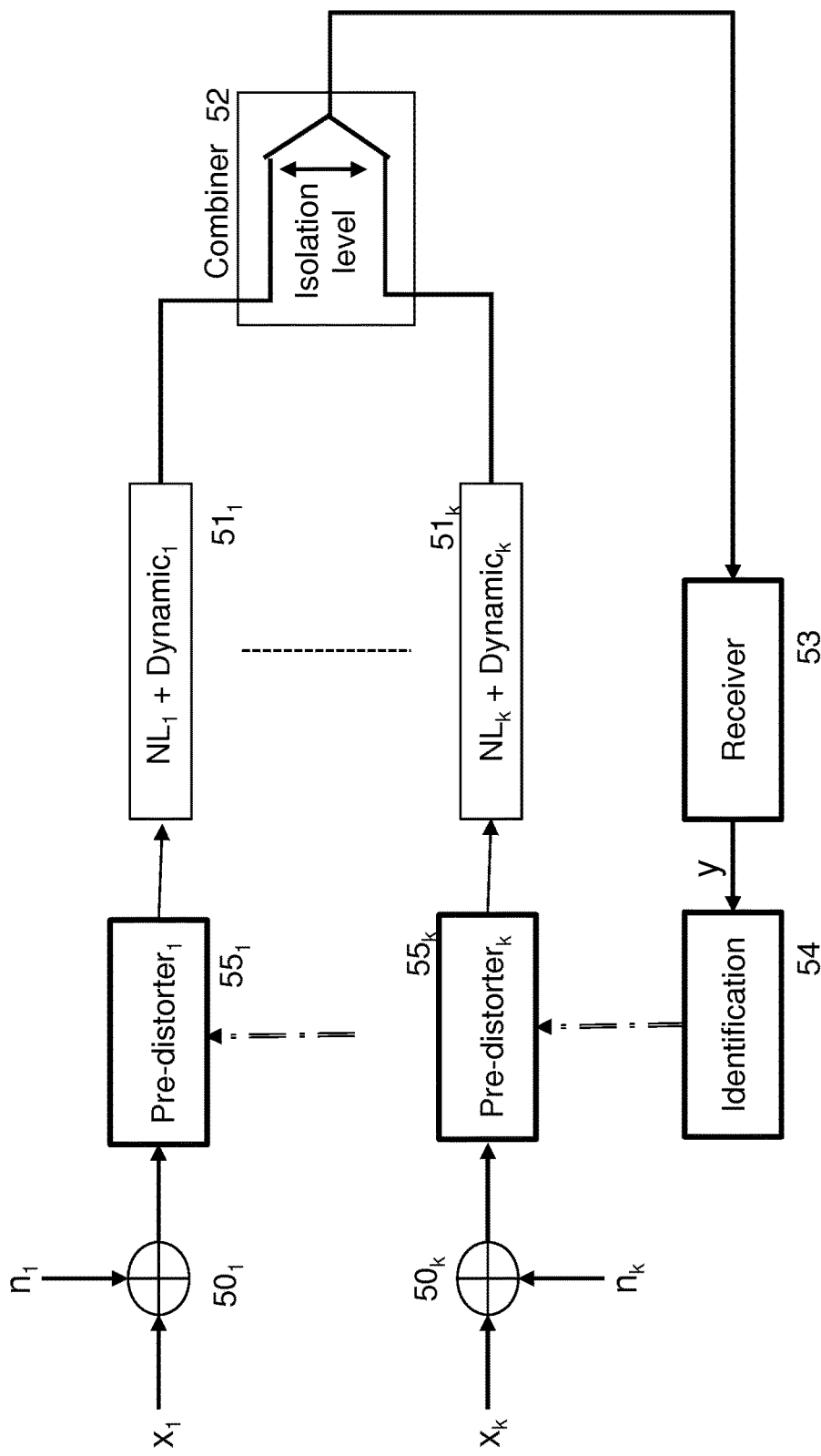
FIG. 18 shows a feedback architecture according to an embodiment of the invention.

FIG. 18 shows a feedback loop according to an embodiment of the invention. FIG. 18 corresponds to FIG. 5. In addition, the pre-distorters $55_1$ to $55k$ are shown. I.e., there is a respective pre-distorter in each input branch. As may be seen from FIG. 18, the output of the identifier 54 controls the pre-distorters (in general: at least one of the pre-distorters, although in the embodiment of FIG. 18, all pre-distorters are controlled by the identifier 54). That is, the identifier 54 determines for each input branch a respective pre-distortion (as described above) which is applied to the input signal which is mixed with the respective noise.

Note that in all of the figures above, the receiver 53 and identifier 54 together are examples of a contribution separator and a determinator, such as the contribution separator 1670 and the determinator 1680.

Embodiments of the invention are described in particular for multicollinear systems, where at least two of the input signals are correlated to each other. However, embodiments of the invention may be applied to other input signals, i.e. not correlated or partly correlated input signals, too.

Embodiments of the invention may be applied for measuring and evaluating feedbacks from any position within the pipe. In particular, the invention may be used for measuring and evaluating feedbacks for linearization, equalization, alarming/protection, complex image suppression, impedance matching, etc.

Embodiments of the invention may be employed in different radio technologies, such as 3G, 4G, 5G networks of 3GPP, a WiFi network, or a V2X network and/or in the respective terminals. The base stations may be those of the respective technology, such as NodeB or eNodeB or an access point. The embodiments may be applied for macro, medium, and/or small cell coverage. Correspondingly, the terminals may be those of the respective technology, and may be e.g. a mobile phone, a smartphone, a laptop, etc. That is, embodiments of the invention may be applied to all radio modules with high order ($\geq 2$) multi-TX transmitters where the transmitted signals' relations are controlled digitally in baseband (e.g., digital beamforming, MIMO, TX diversity, AAS)

Names of network elements, protocols, and methods are based on current standards. In other versions or other technologies, the names of these network elements and/or protocols and/or methods may be different, as long as they provide a corresponding functionality.

If not otherwise stated or otherwise made clear from the context, the statement that two entities are different means that they perform different functions. It does not necessarily mean that they are based on different hardware. That is, each of the entities described in the present description may be based on a different hardware, or some or all of the entities may be based on the same hardware. It does not necessarily mean that they are based on different software. That is, each of the entities described in the present description may be based on different software, or some or all of the entities may be based on the same software.

According to the above description, it should thus be apparent that example embodiments of the present invention provide, for example an amplifier such as an RF amplifier, or a component thereof, an apparatus embodying the same, or a method for controlling and/or operating the same.

Implementations of any of the above described blocks, apparatuses, systems, techniques, means, entities, units, devices, or methods include, as non-limiting examples, implementations as hardware, software, firmware, special purpose circuits or logic, general purpose hardware or controller or other computing devices, a virtual machine, or some combination thereof.

It should be noted that the description of the embodiments is given by way of example only and that various modifications may be made without departing from the scope of the invention as defined by the appended claims.

The invention claimed is:

1. Apparatus, comprising
a first number of input ports, each adapted to input a respective input signal, wherein the first number is at least two;
a second number of noise generator output ports, each corresponding to a respective different one of the input ports and adapted to provide a respective noise, wherein the second number is one less than the first number or equal to the first number;
the second number of mixers, each corresponding to a respective different one of the noise generator output ports and adapted to mix the respective input signal with the respective noise to generate a respective mixed signal;
the first number of pre-distorters, each corresponding to a respective different one of the input ports and adapted to apply a respective preliminary pre-distortion on the respective mixed signal if one of the noise generator output ports corresponds to the respective input port and to apply a respective preliminary pre-distortion on the input signal if none of the noise generator output ports corresponds to the respective input port, in order to obtain a respective pre-distorted signal;
the first number of signal paths, each corresponding to a respective different one of the input ports and adapted to modify the respective pre-distorted signal in order to obtain a respective modified signal;
a combiner adapted to combine the modified signals from the signal paths in order to obtain an output signal;
a contribution separator adapted to separate, for each of the input signals, from a feedback signal and based on the respective noise and the respective input signal, a contribution of the respective input signal to the output signal, wherein the feedback signal is based on the output signal;
a determinator adapted to determine a respective pre-distortion for at least one of the input signals and to replace the respective preliminary pre-distortion by the respective determined pre-distortion such that, if the determined respective pre-distortion is applied by the respective pre-distorter to the respective mixed signal or input signal, the respective contribution will correspond to the respective input signal on which a predefined function is applied, wherein the predefined function is at least one of non-linear and dynamic and has a third number of predefined parameters.

2. Apparatus, comprising
a first number of input ports, each adapted to input a respective input signal, wherein the first number is at least two;
the first number of pre-distorters, each corresponding to a respective different one of the input ports and adapted to apply a respective preliminary pre-distortion on the respective input signal in order to obtain a respective pre-distorted signal;
a second number of noise generator output ports, each corresponding to a respective different one of the input ports and adapted to provide a respective noise, wherein the second number is one less than the first number or equal to the first number;
the second number of mixers, each corresponding to a respective different one of the noise generator output ports and adapted to mix the respective pre-distorted signal with the respective noise to generate a respective mixed signal;
the first number of signal paths, each corresponding to a respective different one of the input ports and adapted to modify the respective pre-distorted signal if none of the mixers corresponds to the respective input port and to modify the mixed signal if one of the mixers corresponds to the respective input port, in order to obtain a respective modified signal;
a combiner adapted to combine the modified signals from the signal paths in order to obtain an output signal;
a contribution separator adapted to separate, for each of the input signals, from a feedback signal and based on the respective noise and the respective input signal, a contribution of the respective input signal to the output signal, wherein the feedback signal is based on the output signal;
a determinator adapted to determine a respective pre-distortion for at least one of the input signals and to replace the respective preliminary pre-distortion by the respective determined pre-distortion such that, if the determined respective pre-distortion is applied by the respective pre-distorter to the respective input signal, the respective contribution will correspond to the respective input signal on which a predefined function is applied, wherein the predefined function is at least one of non-linear and dynamic and has a third number of predefined parameters.

3. The apparatus according to claim 1, wherein at least one of the signal paths comprises an amplifier.

4. The apparatus according to claim 1, wherein the determinator is adapted to, for the respective input signal, determine the third number of actual parameters of the predefined function by fitting the predefined function to the respective contribution, and to determine the respective pre-distortion by inverting the predefined function with the third number of actual parameters.

5. The apparatus according to claim 1, wherein the combiner is isolated, or wherein the combiner is non-isolated.

6. The apparatus according to claim 1, wherein the predefined function is one of a polynomial of an order of two, or three, or four, or five, or higher, a polynomial with memory, and a piece-wise combination of the polynomials and/or the polynomials with memory.

7. The apparatus according to claim 1, wherein the noise generator output ports are adapted such that each of the noises is not correlated to each of the other ones of the noises, or such that each of the noises is substantially not correlated to each of the other ones of the noises.

8. The apparatus according to claim 1, wherein each of the noises is at least one of random noise and impulsive noise.

9. The apparatus according to claim 1, wherein the determined pre-distortion adjusts a path of one input signal relative to at least one other path of another one of the input signals.

10. The apparatus according to claim 1, wherein at least one of the combiner, the contribution separator, and the determinator is implemented as a passive circuit.

11. Method, comprising
inputting respective input signals into a first number of input ports, wherein the first number is at least two;
providing respective noises at a second number of noise generator output ports, wherein each noise generator output port corresponds to a respective different one of the input ports, and the second number is one less than the first number or equal to the first number;
mixing each of noises with the respective input signal to generate a respective mixed signal;

applying a respective preliminary pre-distortion on each of the mixed signals and applying a respective preliminary pre-distortion on the input signal if it is not mixed with any of the noises, in order to obtain pre-distorted signals;

inputting each of the pre-distorted signals into a respective different signal path adapted to modify the respective pre-distorted signal in order to obtain a respective modified signal;

combining the modified signals from the signal paths in order to obtain an output signal;

separating, for each of the input signals, from a feedback signal and based on the respective noise and the respective input signal, a contribution of the respective input signal to the output signal, wherein the feedback signal is based on the output signal;

determining a respective pre-distortion for at least one of the input signals and to replace the respective preliminary pre-distortion by the respective determined pre-distortion such that, if the determined respective pre-distortion is applied to the respective mixed signal or input signal, the respective contribution will correspond to the respective input signal on which a predefined function is applied, wherein the predefined function is at least one of nonlinear and dynamic and has a third number of predefined parameters.

12. Method, comprising inputting respective input signals into a first number of input ports, wherein the first number is at least two;

applying a respective preliminary pre-distortion on each of the input signals in order to obtain a pre-distorted signals;

providing a respective noise at a second number of noise generator output ports, wherein the second number is one less than the first number or equal to the first number, and each noise generator output port corresponds to a different one of the input ports;

mixing each of the noises with the respective pre-distorted signal to generate mixed signals;

inputting each of the mixed signals into a respective signal path and inputting the pre-distorted signal into a respective signal path if the pre-distorted signal is not mixed with any of the noises, wherein each of the signal paths is adapted to modify the respective mixed signal and pre-distorted signal, respectively, in order to obtain modified signals;

combining the modified signals from the signal paths in order to obtain an output signal;

separating, for each of the input signals, from a feedback signal and based on the respective noise and the respective input signal, a contribution of the respective input signal to the output signal, wherein the feedback signal is based on the output signal;

determining a respective pre-distortion for at least one of the input signals and to replace the respective preliminary pre-distortion by the respective determined pre-distortion such that, if the determined respective pre-distortion is applied to the respective input signal, the respective contribution will correspond to the respective input signal on which a predefined function is applied, wherein the predefined function is at least one of non-linear and dynamic and has a third number of predefined parameters.

13. The method according to claim 11, wherein at least one of the signal paths comprises an amplifier.

14. The method according to claim 11, wherein the determining of at least one of the pre-distortions comprises determining the third number of actual parameters of the predefined function by fitting the predefined function to the respective contribution, and determining the respective pre-distortion by inverting the predefined function with the third number of actual parameters.

15. The method according to claim 11, wherein the modified signals are combined by an isolated combiner, or wherein the modified signals are combined by a non-isolated combiner.

16. The method according to claim 11, wherein the predefined function is one of a polynomial of an order of two, or three, or four, or five, or higher, a polynomial with memory, and a piece-wise combination of the polynomials and/or the polynomials with memory.

17. The method according to claim 11, wherein each of the noises is not correlated to each of the other ones of the noises, or each of the noises is substantially not correlated to each of the other ones of the noises.

18. The method according to claim 11, wherein each of the noises is at least one of random noise and impulsive noise.

19. The method according to claim 11, wherein the determined pre-distortion adjusts a path of one input signal relative to at least one other path of another one of the input signals.

20. The method according to claim 11, wherein at least two of the input signals are correlated with each other.

* * * * *